(12) United States Patent
Hirata

(10) Patent No.: US 7,822,304 B2
(45) Date of Patent: Oct. 26, 2010

(54) LASER BEAM MULTIPLEXER

(75) Inventor: Shoji Hirata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/423,316

(22) Filed: Apr. 14, 2009

(65) Prior Publication Data

US 2009/0262432 A1   Oct. 22, 2009

(30) Foreign Application Priority Data

Apr. 18, 2008   (JP) .............................. 2008-109138

(51) Int. Cl.
| | |
|---|---|
| G02B 6/26 | (2006.01) |
| G02B 6/02 | (2006.01) |
| G02B 6/32 | (2006.01) |
| G02B 6/34 | (2006.01) |
| G02B 6/10 | (2006.01) |
| G02B 6/00 | (2006.01) |
| G02B 5/32 | (2006.01) |
| G02B 27/10 | (2006.01) |
| G03H 1/00 | (2006.01) |
| G03H 1/10 | (2006.01) |
| G03H 1/28 | (2006.01) |
| H01S 3/30 | (2006.01) |
| H01S 3/10 | (2006.01) |
| H01S 3/08 | (2006.01) |
| H04B 10/08 | (2006.01) |
| H04J 14/08 | (2006.01) |

(52) U.S. Cl. .............................. 385/24; 385/14; 385/31; 385/33; 385/37; 385/39; 385/125; 385/146; 385/147; 359/1; 359/10; 359/15; 359/24; 359/35; 359/618; 359/625; 359/627; 359/629; 359/631; 372/6; 372/9; 372/20; 372/96; 372/102; 398/34; 398/35; 398/36; 398/37; 398/38; 398/79; 398/87; 398/89

(58) Field of Classification Search .................. 385/14, 385/24, 31, 33, 37, 39, 125, 146, 147; 359/1, 359/10, 15, 24, 35, 618, 625–631; 372/6, 372/9, 20, 96, 102; 398/34–38, 79, 87, 89
See application file for complete search history.

(56) References Cited

U.S. PATENT DOCUMENTS

| | | | |
|---|---|---|---|
| 5,140,466 A | * | 8/1992 | Parker ........................ 359/633 |
| 2005/0169323 A1 | * | 8/2005 | Spariosu et al. ................ 372/9 |
| 2007/0085023 A1 | * | 4/2007 | Debroche et al. ......... 250/458.1 |
| 2008/0212620 A1 | * | 9/2008 | Abdeldayem .................. 372/6 |

FOREIGN PATENT DOCUMENTS

| | | |
|---|---|---|
| JP | 1970-004917 | 2/1970 |
| JP | 1976002394 | 1/1976 |
| JP | 1989088415 | 4/1989 |
| JP | 1991136015 | 6/1991 |
| JP | 1992149418 | 5/1992 |
| JP | 1999096815 | 4/1999 |
| JP | 2001255407 | 9/2001 |
| JP | 2003195171 | 7/2003 |

OTHER PUBLICATIONS

Roland Diehl(Ed.); "High-Power Diode Lasers: Fundamentals, Technology, Applicantions"; p. 310; 2000; Springer-Verlag Berlin Heidelberg New York.
Japanese Office Action dated Jan. 26, 2010; issued in connection with counterpart Japanese Patent Application No. 2008-109138; pp. 1-3.

* cited by examiner

*Primary Examiner*—Brian M. Healy
*Assistant Examiner*—Hung Lam
(74) *Attorney, Agent, or Firm*—Sonnenschein Nath & Rosenthal LLP

(57) ABSTRACT

A laser beam multiplexer capable of easily multiplexing a plurality of laser beams is provided. A laser beam multiplexer includes a multiplexing element having a hollow portion with a sectional elliptical shape, in which the multiplexing element includes: a plurality of light-incident apertures guiding laser beams from outside toward one of two focal points of the hollow portion, a reflective layer arranged on a wall surface of the hollow portion, and multiplexing a plurality of incident laser beams while reflecting the plurality of laser beams, and a light-emitting aperture guiding laser beams multiplexed by the reflective layer toward outside.

20 Claims, 6 Drawing Sheets

LASER BEAM MULTIPLEXER

BACKGROUND OF THE INVENTION

1. Field of the Invention

The present invention relates to a laser beam multiplexer for multiplexing a plurality of laser beams.

2. Description of the Related Art

As laser beams outputted from lasers such as laser diodes are coherent light having a single wavelength and being in phase, the laser beams are used in various fields such as displays and various processing apparatuses. However, higher-power laser beams have been recently desired in these fields.

One of methods of obtaining higher-power laser beams is a method of multiplexing a plurality of laser beams to increase light intensity. Examples of such a method of multiplexing a plurality of laser beams in related art include a method of superimposing laser beams by a lens, a method of multiplexing p-polarized and s-polarized laser beams (PS multiplexing), and a method of multiplexing laser beams with different wavelengths as described in Roland Diehl (Ed.) "High-Power Diode Lasers: fundamentals, Technology, Applications", p 310, (2000) Springer-Verlag Berlin Heidelberg N.Y.

As illustrated in FIG. 9, in the method of multiplexing laser beams by a lens, a plurality of laser sources 101 are arranged in parallel, and laser beams emitted from the laser sources 101 are condensed by a lens 102 to be multiplexed.

As illustrated in FIG. 10, in the method of PS multiplexing, laser sources 101a and 101b with different polarizations are arranged so as to face a polarizing beam splitter (PBS) 103, and a p-polarized laser beam emitted from the laser source 101a is transmitted through the PBS 103, and an s-polarized laser beam emitted from the laser source 101b is reflected by the PBS 103, thereby the transmitted laser beam and the reflected laser beam are combined with each other. Thereby, the laser beams with different polarizations (which are orthogonally polarized) are multiplexed into one beam. A polarizing prism may be used instead of the PBS 103.

As illustrated in FIG. 11, in the method of multiplexing laser beams with different wavelengths, laser sources 101c and 101d with different wavelengths are arranged so as to face a dichroic mirror 104, and a laser beam with a wavelength $\lambda 1$ emitted from the laser source 101c is transmitted through the dichroic mirror 104, and a laser beam with a wavelength $\lambda 2$ emitted from the laser source 101d is reflected by the dichroic mirror 104, thereby the transmitted beam and the reflected beam are combined with each other.

SUMMARY OF THE INVENTION

As described above, there are some methods of multiplexing a plurality of laser beams in related art, and they are effective to increase light intensity. However, each of the methods has the following issues. First, in the method of multiplexing a plurality of laser beams by a lens, laser beams are superimposed at only one point, so it is difficult to form one narrow pencil of light. There is a method of obtaining a pencil of light by arranging a plurality of laser sources adjacent to one another to emit parallel beams. However, in the method, it is difficult to superimpose laser beams, so while the total light intensity is increased, luminance is not increased.

The method of PS multiplexing is only used to superimpose only a total of two laser beams, that is, a p-polarized laser beam and an s-polarized laser beam, so an increase in the intensity of superimposed laser beams is limited. In the method of multiplexing laser beams with different wavelengths, light intensity may be further increased by using a plurality of dichroic mirrors. In other words, the method has an advantage that when the wavelengths of laser beams are changed, more laser beams may be combined with one another by the dichroic mirrors. However, the method has an issue that the wavelengths of superimposed laser beams are not single wavelengths but various wavelengths.

As described above, although the methods of multiplexing laser beams in related art are effective to increase light intensity, each of the methods has some issues. At present, a simple and effective method with fewer shortcomings has not yet been proposed. Moreover, coupling laser beams into an optical fiber is effective in transmitting combined laser beams, but in related art, it is not easy to couple the combined laser beams into the optical fiber.

It is desirable to provide a laser beam multiplexer capable of easily multiplexing a plurality of laser beams, and capable of easily coupling the laser beams into an optical fiber.

According to an embodiment of the invention, there is provided a laser beam multiplexer including a multiplexing element having a hollow portion with a sectional elliptical shape. The multiplexing element includes: a plurality of light-incident apertures guiding laser beams from outside toward one of two focal points of the hollow portion (the elliptical shape), a reflective layer arranged on a wall surface of the hollow portion, and multiplexing a plurality of incident laser beams while reflecting the plurality of laser beams, and a light-emitting aperture guiding laser beams multiplexed by the reflective layer toward outside.

In the laser beam multiplexer according to the embodiment of the invention, a plurality of laser beams entering from the light-incident apertures into the multiplexing element pass through one of two focal points of the hollow portion, and then the laser beams are reflected by the reflective layer, and pass through the other focal point to be reflected by the reflective layer again. The reflected laser beams are oriented substantially along the major axis of the elliptical shape and are superimposed while repeating such reflection.

In the laser beam multiplexer according to the embodiment of the invention, the multiplexing element having a hollow portion with a sectional elliptical shape is used, and the reflective layer is formed on an inner surface of the multiplexing element, and a plurality of laser beams are introduced so as to pass through one of two focal points. Therefore, the plurality of laser beams are oriented substantially along the major axis of the elliptical shape, and are superimposed on one another, thereby superimposed laser beams as multiplexed light are guided to outside. Therefore, multiplexing of laser beams is easily achieved with a simple configuration, and the invention is applicable to a laser display demanding high power, or the like.

Other and further objects, features and advantages of the invention will appear more fully from the following description.

DETAILED DESCRIPTION OF THE PREFERRED EMBODIMENTS

Preferred embodiments of the present invention will be described in detail below referring to the accompanying drawings.

First, the basic principle of the present invention will be described below referring to FIGS. 7A and 7B before describing specific embodiments. As will be described later (refer to FIG. 1 and the like), a laser beam multiplexer according to each of the following embodiments of the invention includes a multiplexing element 10 having a hollow portion 11 with a section of an elliptical shape, and including a reflective layer arranged on an inner surface the multiplexing element 10. The laser beam multiplexer multiplexes a plurality of laser beams through the use of light reflection in an elliptical shape.

Figure 7A:
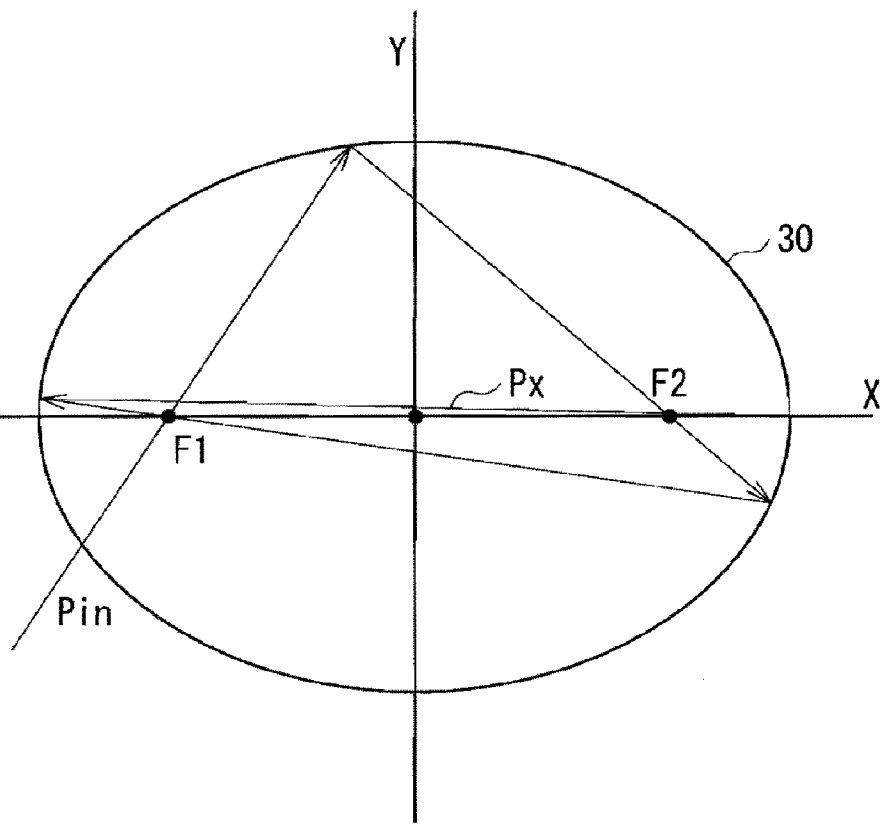
FIGS. 7A and 7B are illustrations for describing the nature of a laser beam reflected inside an ellipse.
Figure 7B:
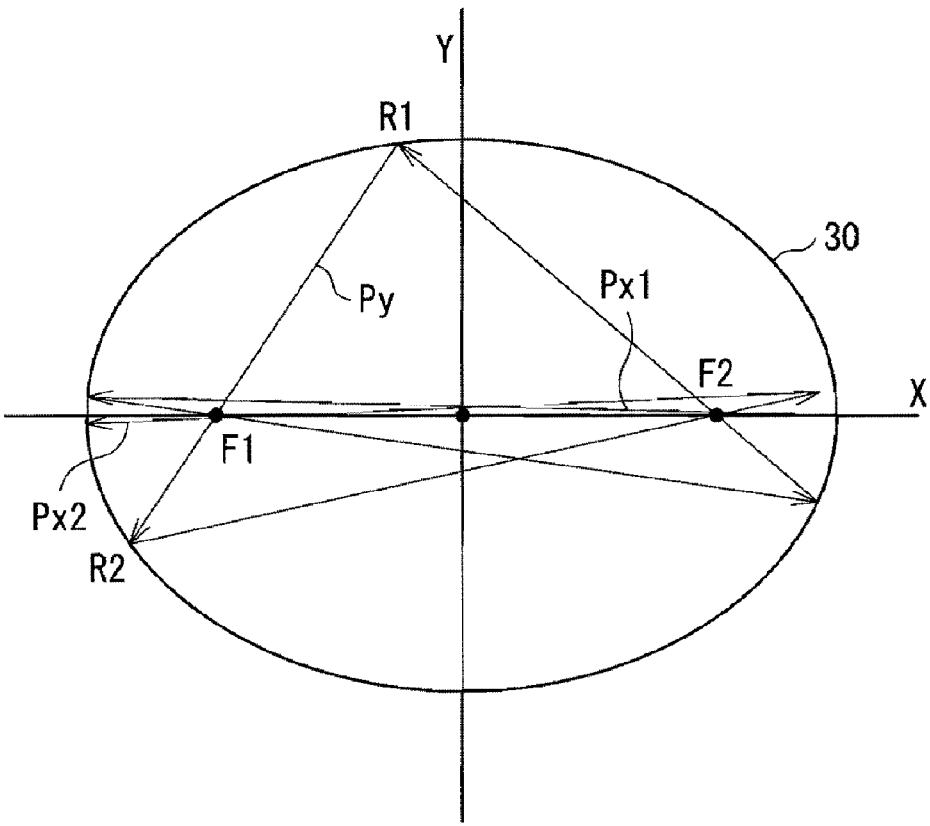

FIG. 7A illustrates a state of reflection of a light beam entering from outside of an ellipse 30 to inside of the ellipse 30, and then passing through focal points F1 and F2, and FIG. 7B illustrates a state of reflection in the case where the light beam illustrated in FIG. 7A is reversed. The nature of a light beam in the case where light enters into such an elliptical shape, and is reflected inside the elliptical shape is as follow.

As illustrated in FIG. 7A, light Pin entering from outside of the ellipse 30 to inside of the ellipse 30 passes through one focal point F1, and then the light Pin is reflected on an inner surface of the ellipse 30, and passes through the focal point F2. This is caused by features of the ellipse. The light Pin passing through the other focal point F2 is reflected on the inner surface of the ellipse 30 a few times to become light Px substantially parallel to the major axis (X axis) of the ellipse 30.

The light may be reversed. Therefore, as illustrated in FIG. 7B, when light Px1 substantially parallel to the above-described X axis is reversed, the light Px1 is changed into light Py along the minor axis (Y axis) of the ellipse 30 by a few reflections. In this case, such light Py substantially parallel to the Y axis has one feature. When the ellipse 30 is divided along the Y axis into a left half and a right half, the light Py may undergo two reflections R1 and R2 on an inner surface of a left half region or a right half region of the ellipse 30. In FIG. 7B, the light Py substantially parallel to the Y axis is reflected successively twice on the inner surface of the left half region of the ellipse 30 (reflected light R1 and R2). Thus, while light successively reflected in one of half regions of the ellipse 30 repeats reflection in the other half region, the light is changed into light Px2 substantially parallel to the X axis again.

Therefore, it is obvious that the light Pin has a nature that in the case where the light Pin enters into an ellipsoid capable of reflecting light on an inner surface thereof so as to pass through one of the focal points F1 and F2, the light Pin is changed into the light Px coming very close to the major axis direction after repeating reflection a few times. The present invention utilizes the nature of a light beam repeating reflection in such an ellipse. Now, specific embodiments will be described below.

First Embodiment

Figure 1:
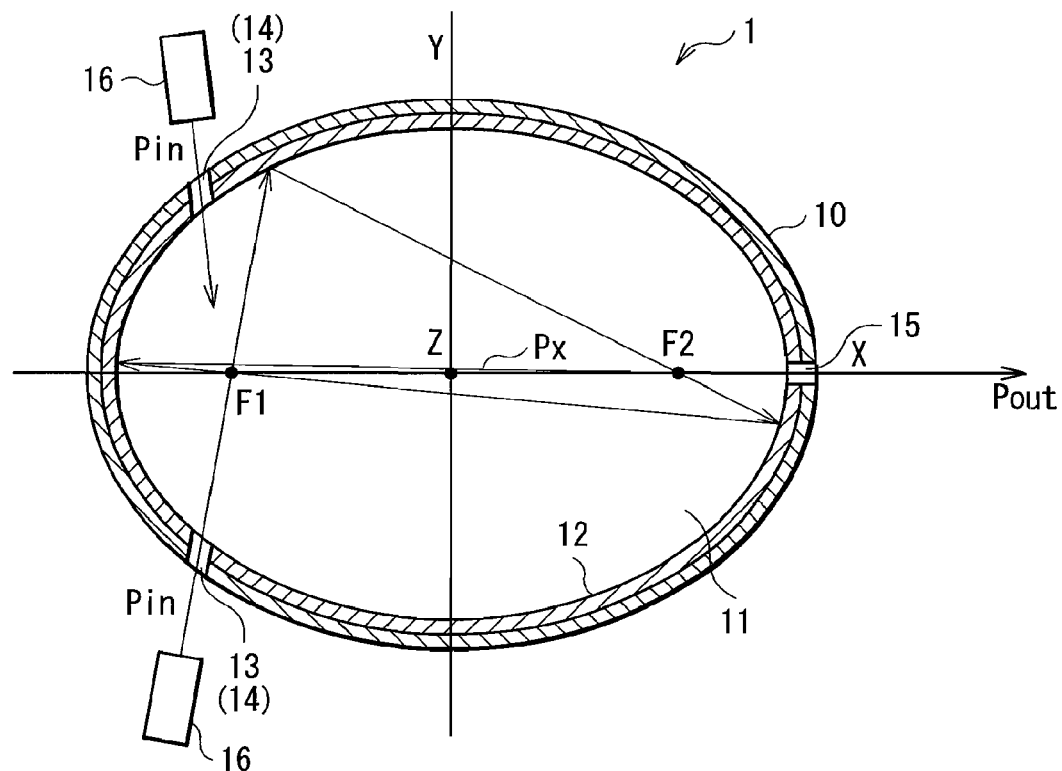
FIG. 1 is a sectional view of a laser beam multiplexer according to a first embodiment of the invention.

FIG. 1 illustrates a laser beam multiplexer 1 according to a first embodiment of the invention. The laser beam multiplexer 1 includes a plurality of (two in this case) laser sources 16 around a multiplexing element 10. The laser sources 16 may be integrated with the multiplexing element 10, or may be formed separately from the multiplexing element 10.

The multiplexing element 10 has a spheroidal shape generated by rotating an elliptical shape around its major axis (X axis), and the inside of the multiplexing element 10 is hollow (the hollow portion 11). A reflective layer 12 is formed on the whole wall surface of the hollow portion 11, and the reflective layer 12 reflects laser beams emitted from the laser sources 16 arranged outside the multiplexing element 10. In the multiplexing element 10, it is only necessary for the sectional shape of the hollow portion 11 to be an elliptical shape, and the outside shape of the multiplexing element 10 is not specifically limited.

A plurality of (two in this case) light-incident apertures 13 are arranged on the wall of the multiplexing element 10, and laser beams Pin emitted from the laser sources 16 enter into the multiplexing element 10 through the light-incident apertures 13. To prevent light reflected on a wall surface (the reflective layer 1) of the hollow portion 11 from being leaked to outside, it is necessary for the diameters of the light-incident apertures 13 to be a minimal diameter allowing the laser beams Pin to pass therethrough. In the light-incident apertures 13, collimator lenses 14 are arranged to narrowly collimate (parallelize) the laser beams Pin entering into the hollow portion 11.

In the multiplexing element 10, one light-emitting aperture 15 is arranged, and laser beams are emitted to outside through the light-emitting aperture 15. The light-emitting aperture 15 is arranged in one of two positions where the major axis, that is, the X axis of a spheroid intersects with the wall of the multiplexing element 10. The light-emitting aperture 15 also has a minimal diameter allowing the laser beams Px coming close to the major axis direction of an ellipse to pass therethrough, because the laser beams reflected on the wall surface (the reflective layer 12) of the hollow portion 11 is prevented from being leaked to the outside.

The laser sources 16 are arranged in positions near the two light-incident apertures 13, respectively. The direction of each of the laser sources 16 is adjusted in a direction (a focal point direction) in which the emitted laser beam enters into the hollow portion 11 through each of the light-incident apertures 13, and then passes through one of two focal points F1 and F2 in a sectional elliptical shape.

Preferably, the laser sources 16 are adjusted in a direction in which the laser beams are allowed to enter into the hollow portion 11 at a large angle substantially orthogonal to the major axis, that is, the X axis of the elliptical shape, because the number of times of reflection until the laser beams repeating reflection in the hollow portion 11 become substantially parallel to the X axis is reduced, and the light-incident apertures 13 are prevented from interfering with reflection of other laser beams being reflected on the wall surface (the reflective layer 12) of the hollow portion 11. In other words, when the direction of each laser source 16 is adjusted so that a laser beam emitted from the laser source 16 passes through the light-incident aperture 13 and a focal point (F1 in FIG. 1) on a side closer to the light-incident aperture 13, and then the laser beam is first reflected on the reflective layer 12 in a region including the focal point F1, the laser beam Pin has an angle substantially perpendicular to the X axis, that is, an angle substantially along an YZ plane.

Such a laser beam multiplexer 1 may be manufactured by the following steps, for example. First, half multiplexing elements with the shape of a half of the multiplexing element 10 are formed by casting or the like, and then the reflective layer 12 is formed on an inner surface of each half multiplexing element. The reflective layer 12 may be any layer capable of reflecting a laser beam, and the reflective layer 12 is formed by forming a film of Au (gold) by a film formation method such as evaporation or sputtering, or by alternately laminating high-refractive index layers and low-refractive index layers to form a dielectric multilayer film. Next, a plurality of light-incident apertures 13 and the light-emitting aperture 15 are formed so as to penetrate through the half multiplexing elements and the reflective layer 12. Positions where the laser beam is reflected are determined by performing ray-tracing simulation in advance, and the light-incident apertures 13 may be arranged so as to keep away from the positions. In other words, the positions where the light-incident apertures 13 are formed may be geometrically easily determined so as not to interfere with reflection of the laser beam. Next, collimator lenses 14 are fixed to the plurality of light-incident aperture 13, respectively.

Next, two half multiplexing elements are bonded so as to face each other, thereby the multiplexing element 10 is obtained. Finally, a plurality of laser sources 16 are arranged around the multiplexing element 10 in proximity to the light-incident apertures 13, respectively, and the position of each of the laser sources 16 is adjusted in a direction where the laser beam passes through the light-incident aperture 13 and the focal points F1 and F2, thereby the laser beam multiplexer 1 illustrated in FIG. 1 is completed.

In the laser beam multiplexer 1 according to the embodiment, when a laser beam is emitted from one of the laser sources 16, the laser beam is collimated by the collimator lens 14 arranged in one of the light-incident aperture 13, and then the laser beam enters into the inside (the hollow portion 11) of the multiplexing element 10. As illustrated in FIG. 1, the laser beam Pin entering into the inside of the multiplexing element 10 passes through one focal point F1, and then the laser beam Pin is reflected on the reflective layer 12. The focal point F1 is arranged in a left half divided along the YZ plane of the hollow portion 11, so when light passing through the focal point F1 is first reflected in a left half region of the hollow portion 11, the laser beam Pin enters into the hollow portion 11 substantially parallel to the Y axis. After that, the laser beam Pin passes through the focal point F2, and repeats reflection in a right half of the hollow portion 11 and reflection in the left half of the hollow portion 11 to become the laser beam Px close to the X axis.

The other laser beam entering from the other laser source 16 so as to pass through the focal point F1 undergoes the same process, so two laser beams Px close to the X axis are superimposed on each other. Therefore, when the number of laser beams Pin entering into the hollow portion 11 is increased, a large number of laser beams Px close to the X axis are superimposed on one another, thereby light beam density is increased. Superimposition of the plurality of laser beams Px in this case is not perfect superimposition to be exact, but practically effective superimposition. A luminous flux formed by superimposing the plurality of laser beams on one another is outputted to outside of the multiplexing element 10 through the light-emitting aperture 15.

Thus, in the embodiment, a plurality of light sources 16 are arranged outside the multiplexing element 10 with a sectional elliptical shape, and the laser beams Pin enter from the laser sources 16 toward the focal points F1 and F2, so a plurality of laser beams Px reflected inside the multiplexing element 10 are allowed to gradually come close to the major axis (the X axis), and are allowed to be superimposed on one another. Thereby, the light beam density may be increased, and separation after superimposition may be reduced. In addition, the laser beam multiplexer 1 has a simple configuration, so its manufacturing cost may be reduced, and the multiplexing element 10 has a spheroidal shape (an oval shape), so mechanical strength is sufficient, and reliability is high.

Moreover, in related art, light beams are superimposed on one another by a convex lens; however, in the embodiment, light beams are superimposed on one another without using the convex lens, so the laser beam multiplexer 1 according to the embodiment has little influence of aberration caused by the convex lens.

Further, in the laser beam multiplexer 1, the laser beams Pin entering into the hollow portion 11 are converted into collimated light by the collimator lenses 14, so the spread of reflected light on the reflective layer 12 is prevented. On the other hand, when the laser beams Pin entering into the hollow portion 11 have a spread, the spread of the light beams is increased by reflection. When the reflected light has a spread, laser beams Pout outputted from the light-emitting aperture 15 to outside become substantially parallel to the major axis (the X axis), but the whole spread angle is increased. In other words, it is difficult to obtain a light beam which is substantially parallel to the major axis direction and has a narrow divergent angle. On the other hand, in the embodiment, the collimator lenses 14 are arranged in the light-incident apertures 13, so such an issue does not occur.

In the laser beam multiplexer 1, guide light is easily introduced. More specifically, one of a plurality of laser beams entering from the light-incident apertures 13 may be used as the guide light.

Other embodiments of the invention will be described below. In the descriptions of the following embodiments, like components are denoted by like numerals as of the first embodiment, and will not be further described.

Second Embodiment

Figure 2:
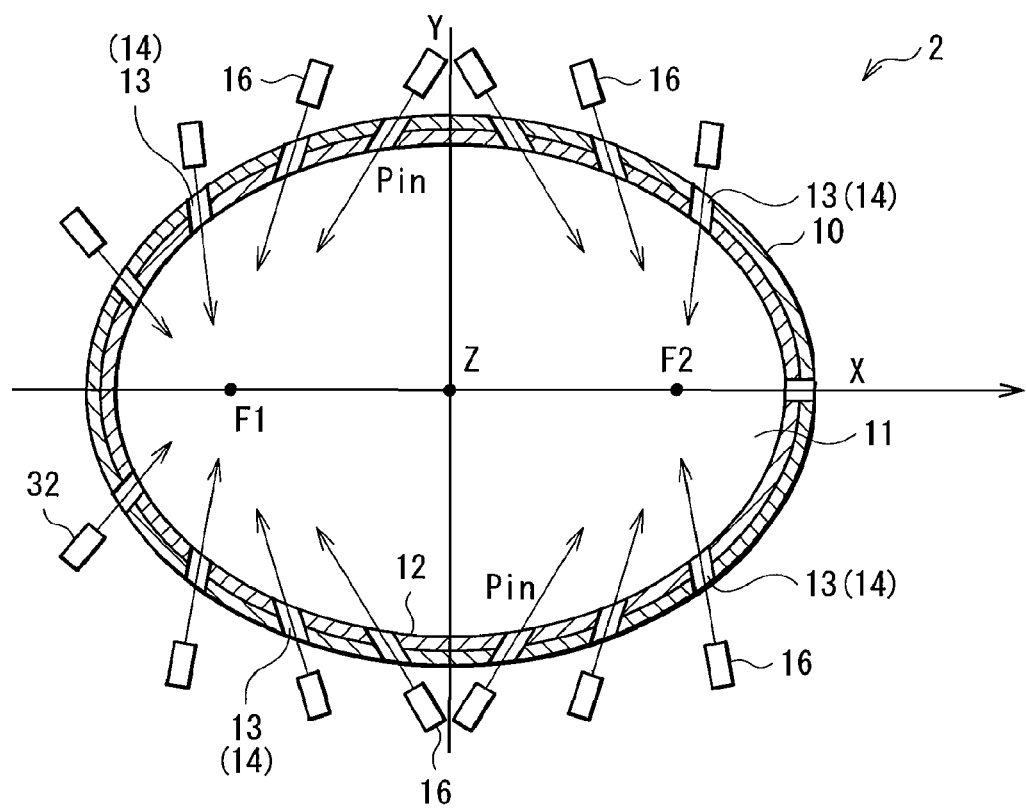
FIG. 2 is a sectional view of a laser beam multiplexer according to a second embodiment of the invention.

FIG. 2 illustrates the configuration of a laser beam multiplexer 2 according to a second embodiment of the invention. The laser beam multiplexer 2 includes a larger number of laser sources 16 than the laser beam multiplexer 1. Each of the laser sources 16 emits a laser beam Pin toward any one of the focal points F1 and F2.

More specifically, the laser sources 16 arranged on a left half side divided along a YZ plane of the hollow portion 11 are positioned so that a laser beam passes through the focal point F1 via the collimator lens 14 arranged in the light-incident aperture on the left half side. On the other hand, the laser sources 16 arranged on a right half side of the hollow portion 11 are positioned so that a laser beam passes through the focal point F2 via the collimator lens 14 arranged in the light-incident aperture on the right half side.

In the laser beam multiplexer 2, a larger number of light-incident apertures 13 are necessary, so it is necessary to prevent the light-incident apertures 13 from interfering with the reflection of the laser beam. Therefore, as described above, each of the light-incident apertures 13 is necessarily arranged in a position where the laser beam entering into the hollow portion 11 is reflected in a half region into which the laser beam enters.

In other words, in the laser beam multiplexer 2, the laser beam emitted from the laser source 16 arranged in the left half of the multiplexing element 10 enters into the hollow portion 11 through the collimator lens 14, and passes through the one focal point F1. After that, the laser beam is reflected by the reflection layer 12 in a left half region of the hollow portion 11, and passes through the other focal point F2, and then the laser beam repeats reflection by the reflective layer 12 a plurality of times, thereby the laser beam becomes a light beam substantially along the major axis (the X axis). On the other hand, the laser beam emitted from the laser source 16 arranged on the right half side of the multiplexing element 10 enters into the hollow portion 11 through the collimator lens 14, and passes through the other focal point F2. After that, the laser beam is reflected by the reflective layer 12 in a right half region of the hollow portion 11, and passes through the one focal point F1, and then the laser beam repeats reflection by the reflective layer 12 a plurality of times, thereby the laser beam becomes a light beam substantially along the X axis. Therefore, when the laser beams emitted from the laser sources 16 become light beams substantially along the major axis in the multiplexing element 10, the laser beams are multiplexed.

Thus, in the embodiment, a large number of laser sources 16 are arranged around the multiplexing element 10 (that is, in a direction rotating around the Z axis), so the number of laser beams to be superimposed is easily increased. In addition, in the laser beam multiplexer 2, it is not necessary to arrange the laser sources 16 adjacent to one another, and the laser sources 16 may be arranged diffusely, so a system taking account of exhaust heat may be configured.

Third Embodiment

Figure 3:
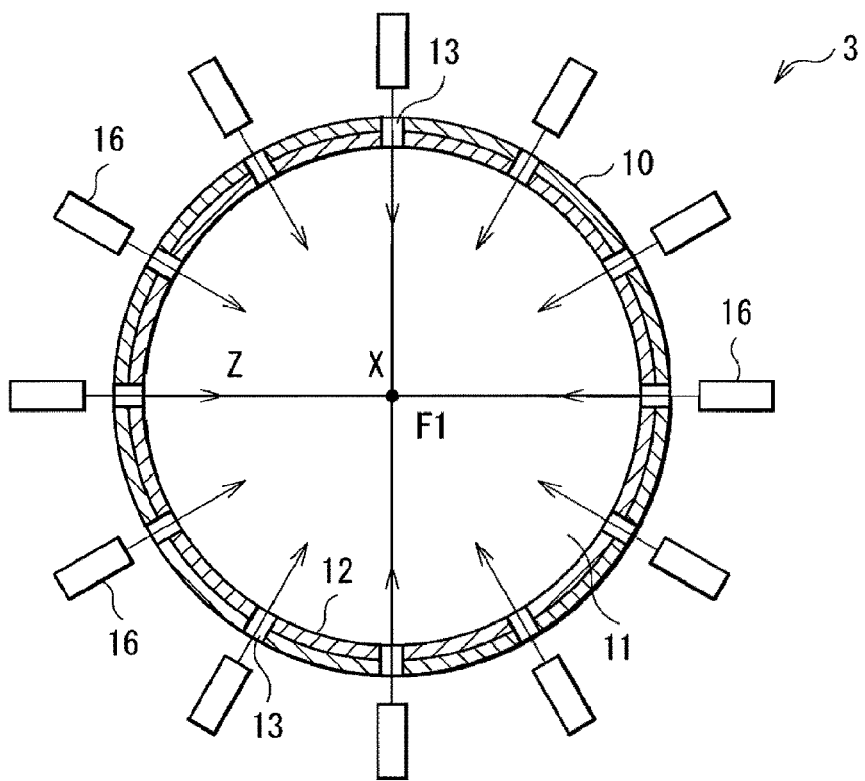
FIG. 3 is a sectional view of a laser beam multiplexer according to a third embodiment of the invention.

FIG. 3 illustrates the configuration of a laser beam multiplexer 3 according to a third embodiment, and illustrates an arrangement state of a plurality of laser sources 16 viewed from the major axis (X axis) direction. In the laser beam multiplexer 3, a plurality of laser sources 16 are arranged around the multiplexing element 10 in a direction rotating around the X axis.

Thus, in the embodiment, a plurality of laser sources 16 are arranged in a circumferential direction around the X axis of the multiplexing element 10, so the number of laser beams to be superimposed is easily increased. Moreover, when the laser sources 16 are three-dimensionally arranged by the combination of the third embodiment and the second embodiment, the density of superimposed laser beams is further increased. Other configurations, functions and effects are the same as those in the second embodiment.

Fourth Embodiment

Figure 4:
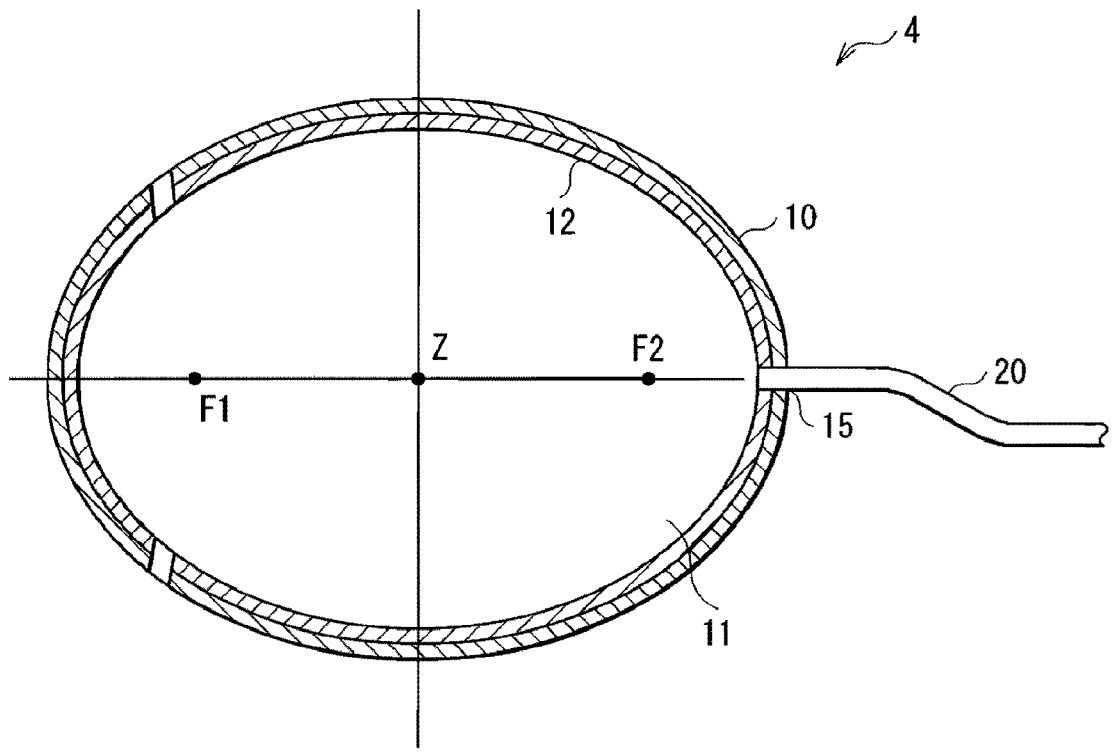
FIG. 4 is a sectional view of a laser beam multiplexer according to a fourth embodiment of the invention.

FIG. 4 illustrates the configuration of a laser beam multiplexer 4 according to a fourth embodiment. In the laser beam multiplexer 4, the light-emitting aperture 15 of the multiplexing element 10 is coupled to an end of an optical fiber 20. The end of the optical fiber 20 may enter into the hollow portion 11, but the end of the optical fiber 20 is prevented from reaching the position of the focal point F2 on a side close to the light-emitting aperture 15, because when the optical fiber 20 reaches the focal point F2, the laser beam repeating reflection in the hollow portion 11 is blocked.

In the laser beam multiplexer 4, a plurality of laser beams repeat reflection by the wall surface (the reflective layer 12) of the hollow portion 11 to be oriented substantially along the X axis and be superimposed, and when multiplexed light beams pass through the light-emitting aperture 15, the multiplexed light beams enter into the optical fiber 20. Thus, in the embodiment, fiber coupling is easily provided.

Fifth Embodiment

Figure 5:
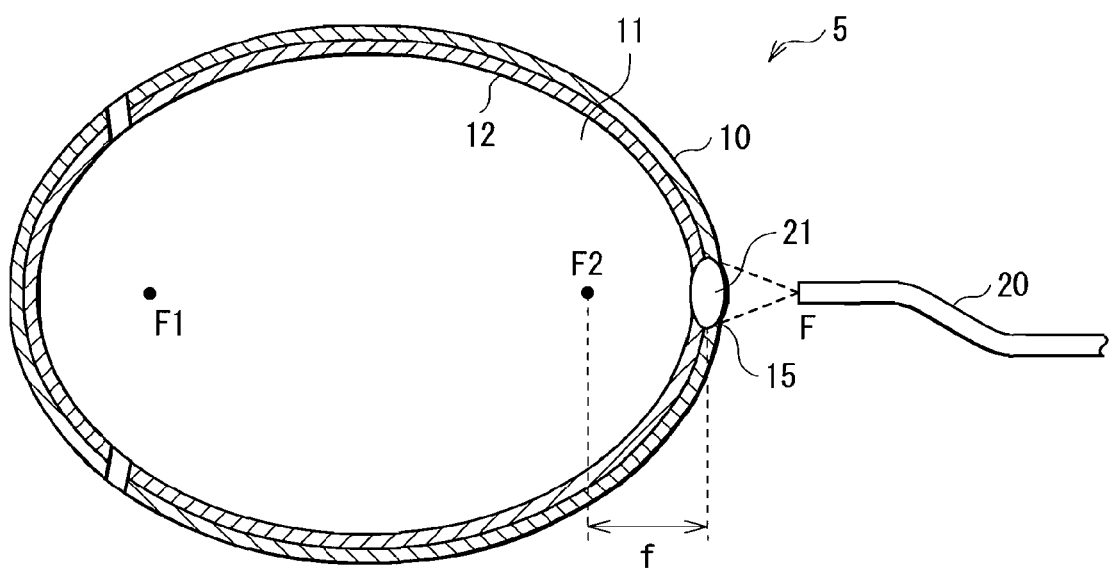
FIG. 5 is a sectional view of a laser beam multiplexer according to a fifth embodiment of the invention.

FIG. 5 illustrates a laser beam multiplexer 5 according to a fifth embodiment. In the laser beam multiplexer 5, a converging lens 21 is arranged in the light-emitting aperture 15 of the multiplexing element 10, and an end of the optical fiber 20 is arranged at a focal point F positioned outside the converging lens 21. In the converging lens 21, a distance to the focal point F2 on a side close to the light-emitting aperture 15 is referred to as a focal length f, and as a result, the converging lens 21 is focused outside the multiplexing element 10.

In the laser beam multiplexer 5, a plurality of laser beams repeat reflection by the reflective layer 12 to be oriented substantially along the X axis and be superimposed, and multiplexed light beams pass through the converging lens 21, and are condensed outside the multiplexing element 10 so as to enter into the optical fiber 20.

Thus, in the embodiment, the laser beams are condensed by the converging lens 21, so the laser beams enter into the optical fiber more efficiently than the case of the fourth embodiment. In other words, fiber coupling efficiency is further improved.

Sixth Embodiment

Figure 6:
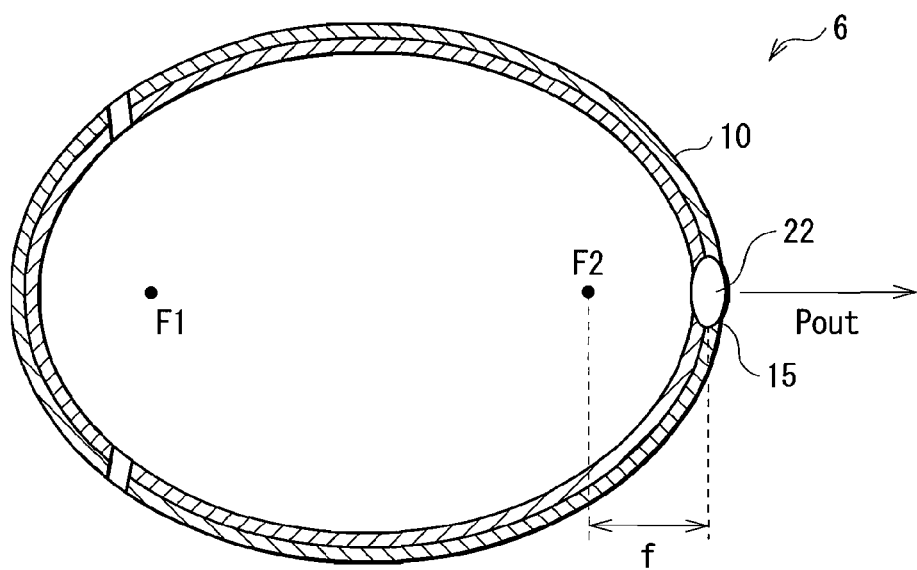
FIG. 6 is a sectional view of a laser beam multiplexer according to a sixth embodiment of the invention.

FIG. 6 illustrates the configuration of a laser beam multiplexer 6 according to a sixth embodiment. The laser beam multiplexer 6 includes a collimator lens 22 in the light-emitting aperture 15 of the multiplexing element 10. In the collimator lens 22, a length to the focal point F2 on a side close to the light-emitting aperture 15 is referred to as the focal length f.

In the laser beam multiplexer 6, a plurality of laser beams repeat reflection by the reflective layer 12 to be oriented substantially along the X axis and be superimposed, and multiplexed light beams pass through the collimator lens 22 to be collimated. In other words, output light beams Pout from the multiplexing element 10 which are substantially superimposed are transformed into a collimated pencil of light, so the light beams are easily used in various applications.

Figure 8:
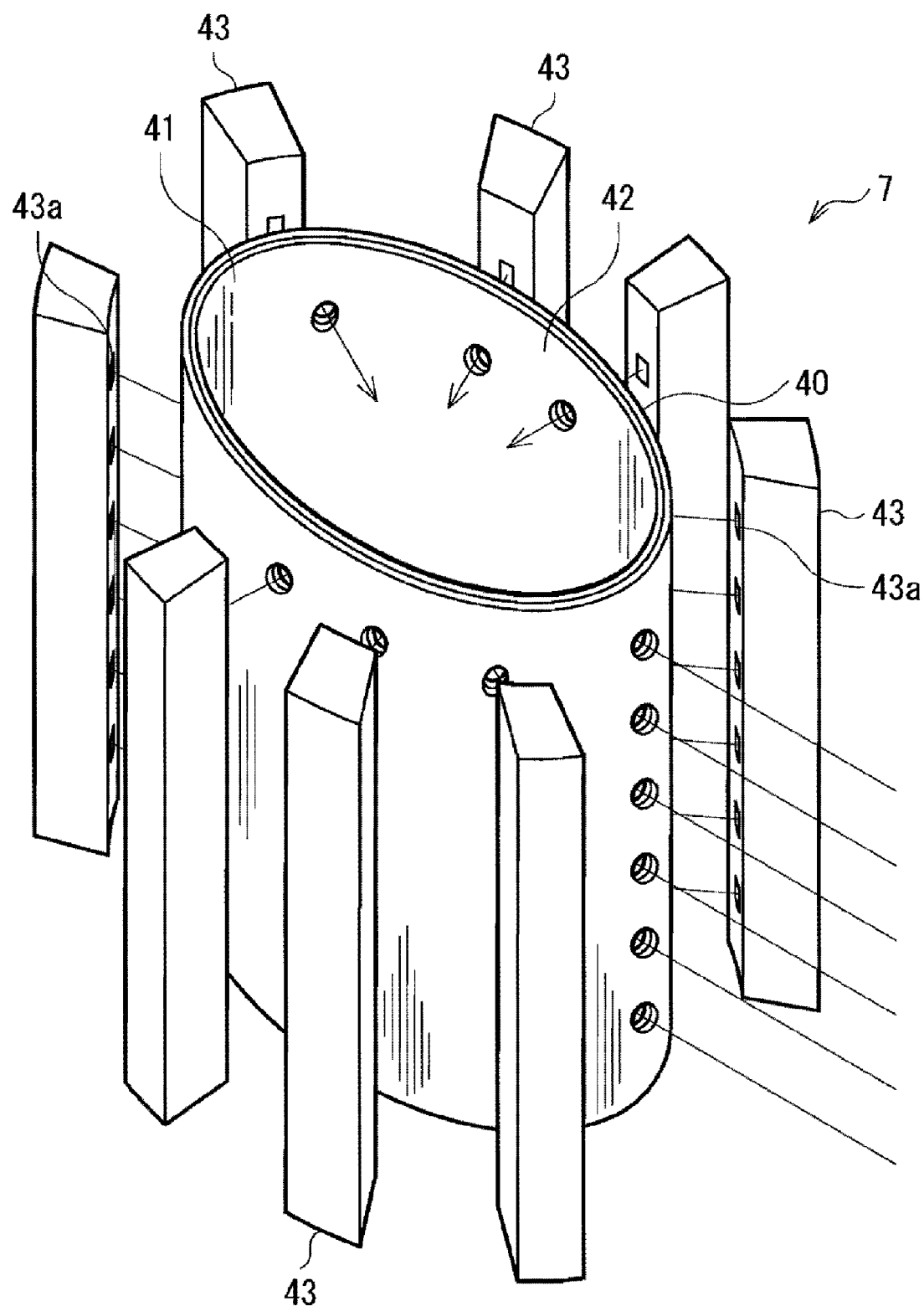
FIG. 8 is an illustration for describing a modification of the invention.
Figure 9:
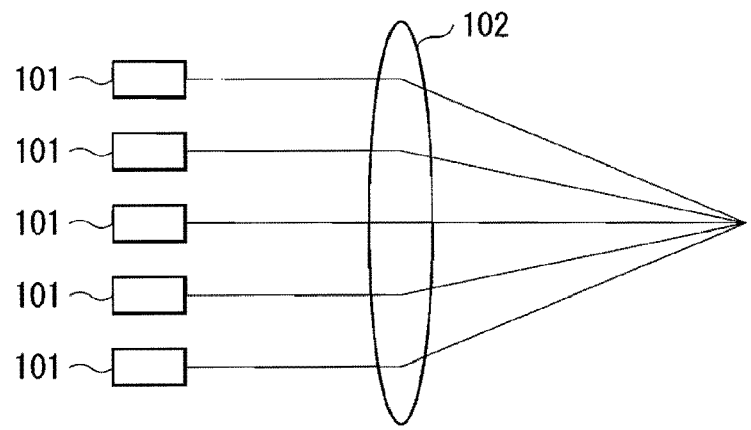
FIG. 9 is an illustration for describing one example of a multiplexing method in related art.
Figure 10:
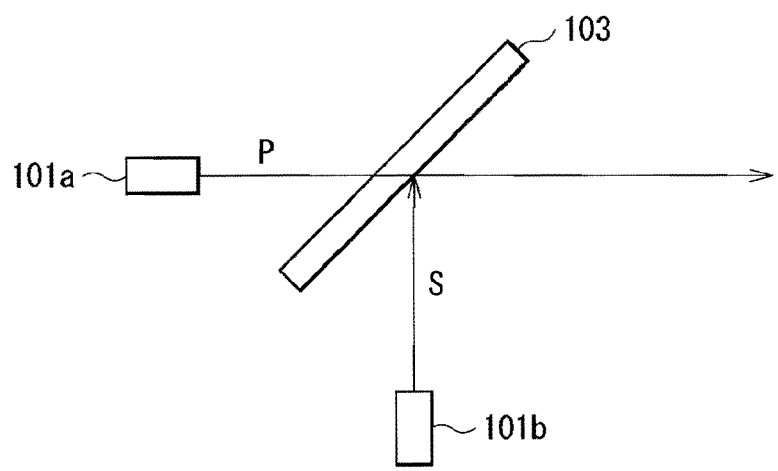
FIG. 10 is an illustration for describing another multiplexing method in related art.
Figure 11:
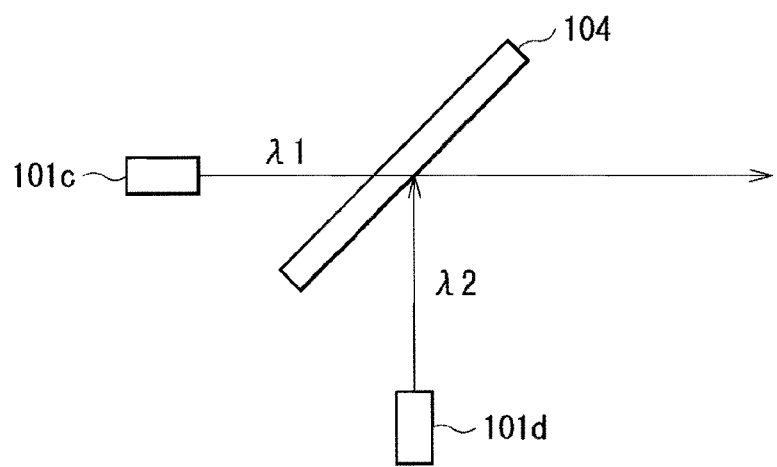
FIG. 11 is an illustration for describing still another multiplexing method in related art.

Although the present invention is described referring to the first to sixth embodiments, the invention is not limited to them, and may be variously modified. For example, in the above-described embodiments, the shape of the multiplexing element 10 (the hollow portion 11) is described as a spheroid. However, the multiplexing element of the invention may have at least one elliptical section. In other words, like a laser beam multiplexer 7 illustrated in FIG. 8, a multiplexing element with an elliptical columnar shape may be used. In the laser beam multiplexer 7, a reflective layer 42 is formed on a wall surface of the inside (a hollow portion 41) of a multiplexing element 40, and laser beams emitted from laser sources 42 arranged outside the multiplexing element 40 are reflected by the reflective layer 42. In this case, as the laser sources 43, array type laser sources or stack type laser sources may be used, and light-emitting points of the laser sources 43 are aligned at different heights so that laser beams emitted from the laser sources 43 arranged at the same height are multiplexed. Therefore, in the laser beam multiplexer 7, laser beams at each height are superimposed to be multiplexed.

In related art, stack type light sources are typically used to superimpose array laser beams, but while the total light amount of the array laser beams is increased, it is difficult to increase the density. However, when the elliptical columnar multiplexing element is used, laser beams may be superimposed without increasing the size of a light spot, so the light density may be increased without increasing the area of the light spot.

Moreover, in the above-described embodiments, one multiplexing element 10 is used, but the multiplexing element 10 may be combined with a multiplexing element with the same configuration. More specifically, multiplexed light beams obtained in a plurality of multiplexing elements 10 may be superimposed by another multiplexing element. Thereby, the intensity of the laser beams may be further increased.

Further, in the above-described embodiments, the collimator lenses 14 are arranged in the light-incident apertures 13, but the collimator lenses 14 may be arranged outside the multiplexing element 10.

The laser beam multiplexers 1 to 7 described above are applicable to various devices demanding high power such as a laser display, a laser processing apparatus, a laser medical device, a printer and a laser fusion device. For example, in the laser processing apparatus, when laser beams superimposed by the multiplexing element 10 are guided by the optical fiber 20 to be applied to a wiring pattern on a circuit substrate, a broken wiring pattern may be repaired. Moreover, in the case where any one of the laser beam multiplexers 1 to 7 is applied to the laser medical device, when laser beams superimposed by the multiplexing element 10 are guided by the optical fiber 20 to be applied to a diseased part, the diseased part is instantly burn off.

The present application contains subject matter related to that disclosed in Japanese Priority Patent Application JP 2008-109138 filed in the Japanese Patent Office on Apr. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laser beam multiplexer comprising a multiplexing element having a hollow portion with a sectional elliptical shape,
wherein the multiplexing element includes:
a plurality of light-incident apertures guiding laser beams from outside toward one of two focal points of the hollow portion,
a reflective layer arranged on a wall surface of the hollow portion, the laser beams passing through a focal point before being reflected through another focal point and subsequently multiplexing a plurality of incident laser beams while reflecting the plurality of laser beams, and
a light-emitting aperture guiding laser beams multiplexed by the reflective layer outside the multiplexing element.

2. The laser beam multiplexer according to claim 1, wherein
the hollow portion has a spheroidal shape.

3. The laser beam multiplexer according to claim 1, wherein
the hollow portion has an elliptical columnar shape.

4. The laser beam multiplexer according to claim 1, wherein the laser beams are reflected three or more times by the reflective layer, and
the plurality of light-incident apertures are formed separately from one another in a circumferential direction around an axis orthogonal to a major axis and a minor axis of the elliptical shape.

5. The laser beam multiplexer according to claim 1, wherein
the plurality of light-incident apertures are formed separately from one another in a circumferential direction around the major axis of the elliptical shape.

6. The laser beam multiplexer according to claim 1, wherein
the light-emitting aperture is arranged in one of two positions where the major axis of the elliptical shape intersects with a wall of the multiplexing element.

7. The laser beam multiplexer according to claim 1, further comprising:
laser sources outside the multiplexing element, each of the laser sources corresponding to each of the plurality of light-incident apertures, respectively.

8. The laser beam multiplexer according to claim 1, further comprising:
an optical fiber optically coupled to the light-emitting aperture.

9. The laser beam multiplexer according to claim 1, wherein
a lens for collimating multiplexed laser beams is arranged in the light-emitting aperture.

10. The laser beam multiplexer according to claim 1, wherein
a converging lens is arranged in the light-emitting aperture, and an end of an optical fiber is arranged in a focal point position of the converging lens.

11. The laser beam multiplexer according to claim 1, wherein a plurality of laser sources are attached to the multiplexing element, the plurality of laser sources are directed through the plurality of light-incident apertures to prevent incidence of the laser beams on the plurality of light-incident apertures within the hollow portion during reflection, and the plurality of laser sources are directed through the plurality of light-incident apertures substantially orthogonal to a major axis of the multiplexing element.

12. The laser beam multiplexer according to claim 11, wherein the plurality of light-incident apertures includes a first plurality of light-incident apertures through a first half of the sectional elliptical shape directed at a first focal point and first reflecting corresponding laser beams within the first half of the sectional elliptical shape, the plurality of light-incident apertures includes a second plurality of light-incident apertures through a second half of the sectional elliptical shape directed at a second focal point and first reflecting corresponding laser beams within the second half of the sectional elliptical shape.

13. The laser beam multiplexer according to claim 11, wherein the reflective layer superimposes the laser beams to increase a light beam density for communication outside of the multiplexer through the light-emitting aperture, and collimator lenses are fixed to the first plurality of light-incident apertures and the second plurality of light-incident apertures.

14. The laser beam multiplexer according to claim 11, wherein the plurality of laser sources are positioned about a periphery of the multiplexing element in x, y, and z directions, and the light-emitting aperture includes a converging lens for condensing the laser beams.

15. A laser beam multiplexer system comprising:
- a multiplexing element having a hollow portion with a sectional elliptical shape;
- a first plurality of light-incident apertures through the multiplexing element guiding laser beams from outside the multiplexing element toward a first focal point of the hollow portion;
- a second plurality of light-incident apertures through the multiplexing element guiding laser beams from outside the multiplexing element toward a second focal point of the hollow portion;
- a reflective layer arranged on a wall surface of the hollow portion, the laser beams being reflected three or more times by the reflective layer, the reflective layer multiplexing the laser beams substantially parallel to a major axis of the multiplexing element through reflection; and
- a light-emitting aperture guiding laser beams multiplexed by the reflective layer outside the multiplexing element.

16. The laser beam multiplexer system according to claim 15, wherein laser sources are attached to the multiplexing element, the laser sources are directed through the first plurality of light-incident apertures and the second plurality of light-incident apertures to prevent incidence of the laser beams on the first and second plurality of light-incident apertures within the hollow portion during reflection, the laser sources are directed through the first plurality of light-incident apertures and the second plurality of light-incident apertures substantially orthogonal to the major axis, the first focal point and the first plurality of light-incident apertures are on a first half of the sectional elliptical shape, the second focal point and the second plurality of light-incident apertures are on a second half of the sectional elliptical shape.

17. The laser beam multiplexer system according to claim 16, wherein the first half is a left half of the hollow portion divided along a YZ plane, and the second half is a right half of the hollow portion divided along the YZ plane, a first reflection of the laser beam off of the reflective layer occurring on the first half or the second half corresponding to the half of the first plurality of light-incident apertures and the second plurality of light-incident apertures.

18. The laser beam multiplexer system according to claim 16, wherein the reflective layer superimposes the laser beams to increase a light beam density for communication outside of the multiplexer through the light-emitting aperture, collimator lenses are fixed to the first plurality of light-incident apertures and the second plurality of light-incident apertures.

19. The laser beam multiplexer system according to claim 17, wherein the laser sources are positioned about a periphery of the multiplexing element in x, y, and z directions.

20. The laser beam multiplexer system according to claim 15, wherein the light-emitting aperture includes a converging lens for condensing the laser beams.

* * * * *